US011984458B2

(12) United States Patent
Shang et al.

(10) Patent No.: US 11,984,458 B2
(45) Date of Patent: May 14, 2024

(54) DISPLAY SUBSTRATE AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Tinghua Shang, Beijing (CN); Yang Zhou, Beijing (CN); Zhengwei Luo, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 434 days.

(21) Appl. No.: 17/311,889

(22) PCT Filed: Oct. 20, 2020

(86) PCT No.: PCT/CN2020/122092
§ 371 (c)(1),
(2) Date: Jun. 8, 2021

(87) PCT Pub. No.: WO2021/103853
PCT Pub. Date: Jun. 3, 2021

(65) Prior Publication Data
US 2022/0037376 A1 Feb. 3, 2022

(30) Foreign Application Priority Data
Nov. 26, 2019 (CN) .......................... 201911171262.3

(51) Int. Cl.
H01L 27/12 (2006.01)
(52) U.S. Cl.
CPC ........ *H01L 27/1255* (2013.01); *H01L 27/124* (2013.01); *H01L 27/1248* (2013.01)

(58) Field of Classification Search
CPC ... H01L 27/1255; H01L 27/124; H01L 27/12; H01L 27/1218; H01L 27/1248; G09F 9/00; G09F 9/30; G09F 9/33; G09F 9/372
See application file for complete search history.

(56) References Cited

U.S. PATENT DOCUMENTS 11,302,718 B2 * 4/2022 Hara ..................... H01L 27/127
2016/0240141 A1 8/2016 Lee et al.
(Continued)

FOREIGN PATENT DOCUMENTS

CN 105895002 A 8/2016
CN 106483728 A 3/2017
(Continued)

OTHER PUBLICATIONS

CN2019111712623 First Office Action.
PCT/CN2020/122092 International search report and written opinion.

Primary Examiner — Nikolay K Yushin
(74) Attorney, Agent, or Firm — IPro, PLLC

(57) ABSTRACT

The present disclosure provides a display substrate and a display device. The display substrate includes a display region and a frame region surrounding the display region. The display region includes a first region and a second region, and the quantity of sub-pixels connected to each gate line in the first region is less than the quantity of sub-pixels connected to each gate line in the second region. The display substrate includes a signal line arranged in the frame region, an orthogonal projection of each gate line in the first region onto a base substrate of the display substrate partially overlaps an orthogonal projection of the signal line onto the base substrate, and a capacitor is formed between the signal line and the gate line in the first region to increase a load capacitance of the gate line in the first region.

17 Claims, 5 Drawing Sheets

(56) References Cited

U.S. PATENT DOCUMENTS

| | | |
|---|---|---|
| 2018/0107084 A1 | 4/2018 | Hirata |
| 2019/0107761 A1 | 4/2019 | Yasuda |
| 2019/0304999 A1 | 10/2019 | Wang et al. |
| 2020/0185425 A1* | 6/2020 | Hara .................... G09F 9/30 |
| 2020/0212070 A1 | 7/2020 | Hong et al. |
| 2020/0241369 A1 | 7/2020 | Ding et al. |
| 2021/0216167 A1 | 7/2021 | Zhong et al. |
| 2022/0011639 A1* | 1/2022 | Ohue .................... G02F 1/1334 |
| 2022/0260881 A1* | 8/2022 | Hayashi .................... G09F 9/37 |

FOREIGN PATENT DOCUMENTS

| | | |
|---|---|---|
| CN | 107919090 A | 4/2018 |
| CN | 108010449 A | 5/2018 |
| CN | 108037626 A | 5/2018 |
| CN | 108646477 A | 10/2018 |
| CN | 109065550 A | 12/2018 |
| CN | 109633971 A | 4/2019 |
| CN | 109683751 A | 4/2019 |
| CN | 109712995 A | 5/2019 |
| CN | 109728005 A | 5/2019 |
| CN | 209103062 U | 7/2019 |
| CN | 110827673 A | 2/2020 |
| JP | 2018063348 A | 4/2018 |
| KR | 20190062948 A | 6/2019 |

* cited by examiner

DISPLAY SUBSTRATE AND DISPLAY DEVICE

CROSS-REFERENCE TO RELATED APPLICATION

The present application is the U.S. national phase of PCT Application No. PCT/CN2020/122092 filed on Oct. 20, 2020, which claims a priority of the Chinese patent application No. 201911171262.3 filed on Nov. 26, 2019, which is incorporated herein by reference in its entirety.

TECHNICAL FIELD

The present disclosure relates to the field of display technology, in particular to a display substrate and a display device.

BACKGROUND

With the development of science and technology, more and more devices are equipped with display screens in daily life, such as smart watches and smart refrigerators. Due to various shapes of the devices, the display screens need to be in various shapes to match the shapes of the devices, so there are many situations where the devices need to be equipped with special-shaped screens.

SUMMARY

In a first aspect, the present disclosure provides in some embodiments a display substrate, including a display region and a frame region surrounding the display region. The display region includes a first region and a second region, and the quantity of sub-pixels connected to each gate line in the first region is less than the quantity of sub-pixels connected to each gate line in the second region. The display substrate includes a signal line arranged in the frame region, an orthogonal projection of each gate line in the first region onto a base substrate of the display substrate partially overlaps an orthogonal projection of the signal line onto the base substrate, and a capacitor is formed between the signal line and the gate line in the first region to increase a load capacitance of the gate line in the first region.

In a possible embodiment of the present disclosure, the gate lines in the first region include a first gate line and a second gate line, the first gate line is located between the second region and the second gate line, and the quantity of sub-pixels connected to the first gate line is greater than the quantity of sub-pixels connected to the second gate line.

In a possible embodiment of the present disclosure, an overlapping area between an orthogonal projection of the first gate line onto the base substrate and the orthogonal projection of the signal line onto the base substrate is larger than an overlapping area between an orthogonal projection of the second gate line onto the base substrate and the orthogonal projection of the signal line onto the base substrate.

In a possible embodiment of the present disclosure, the frame region of the display substrate further includes a polysilicon layer arranged at a side of the gate line in the first region away from the signal line, and the polysilicon layer is insulated from the gate line in the first region and electrically connected to the signal line.

In a possible embodiment of the present disclosure, the signal line and the polysilicon layer jointly form a first plate of the capacitor, and the gate line is a second plate of the capacitor.

In a possible embodiment of the present disclosure, the overlapping area between the orthogonal projection of the first gate line onto the base substrate and the orthogonal projection of the signal line onto the base substrate is equal to an overlapping area between an orthogonal projection of the second gate line onto the base substrate and the orthogonal projection of the signal line onto the base substrate.

In a possible embodiment of the present disclosure, an overlapping area between the orthogonal projection of the first gate line onto the base substrate and an orthogonal projection of the polysilicon layer onto the base substrate is larger than an overlapping area between the orthogonal projection of the second gate line onto the base substrate and the orthogonal projection of the polysilicon layer onto the base substrate.

In a possible embodiment of the present disclosure, the overlapping area between the orthogonal projection of the first gate line onto the base substrate and the orthogonal projection of the polysilicon layer onto the base substrate is equal to the overlapping area between the orthogonal projection of the second gate line onto the base substrate and the orthogonal projection of the polysilicon layer onto the base substrate.

In a possible embodiment of the present disclosure, the display substrate further includes a first insulating layer, the first insulating layer includes a first part located between the gate line and the signal line and a second part located between adjacent gate lines, the first part is used to maintain insulation between the gate line and the signal line, and the second part is used to maintain insulation between adjacent gate lines.

In a possible embodiment of the present disclosure, a second insulating layer is further arranged between the polysilicon layer and the gate line, and the second insulating layer is used to maintain insulation between the gate line and the polysilicon layer.

In a possible embodiment of the present disclosure, a via hole penetrating through the second part of the first insulating layer and the second insulating layer is formed in the display substrate, and the signal line is connected to the polysilicon layer through the via hole.

In a possible embodiment of the present disclosure, a shift register unit of the display substrate is located in the frame region and at a side of the signal line close to the display region.

In a possible embodiment of the present disclosure, the gate line in the first region includes a first part, a second part and a third part, an orthogonal projection of the second part onto the base substrate overlaps the orthogonal projection of the signal line onto the base substrate, a first end of the second part is connected to the sub-pixel through the first part, and a second end of the second part is connected to the shift register unit through the third part.

In a possible embodiment of the present disclosure, a capacitor is formed between the second part of the gate line in the first region and the signal line to increase the load capacitance of the gate line in the first region.

In a possible embodiment of the present disclosure, the signal line is a low-level signal line.

In a possible embodiment of the present disclosure, the sub-pixels connected to the gate lines in the first region are arranged in a same mode as the sub-pixels connected to the gate lines in the second region.

In a second aspect, the present disclosure provides in some embodiments a display device which includes the above-mentioned display substrate.

BRIEF DESCRIPTION OF THE DRAWINGS

In order to illustrate the technical solutions of the present disclosure in a clearer manner, the drawings desired for the present disclosure will be described hereinafter briefly. Obviously, the following drawings merely relate to some embodiments of the present disclosure, and based on these drawings, a person skilled in the art may obtain the other drawings without any creative effort.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

The quantity of sub-pixels connected to some gate lines may be different from the quantity of sub-pixels connected to the other gate lines in a special-shaped screen, so there is a situation where a load of some gate lines is different from that of the other gate lines in the screen. At this time, a signal delay of some gate line is different from a signal delay of the other gate lines, and thereby a display effect of a display device is adversely affected.

An object of the present disclosure is to provide a display substrate and a display device to solve the problem in the related art where the signal delay of some lines is different from the signal delay of the other lines caused when the load of some gate lines is different from the load of the other gate lines in the special-shaped screen, thereby to improve a display effect of the display device.

Figure 1:
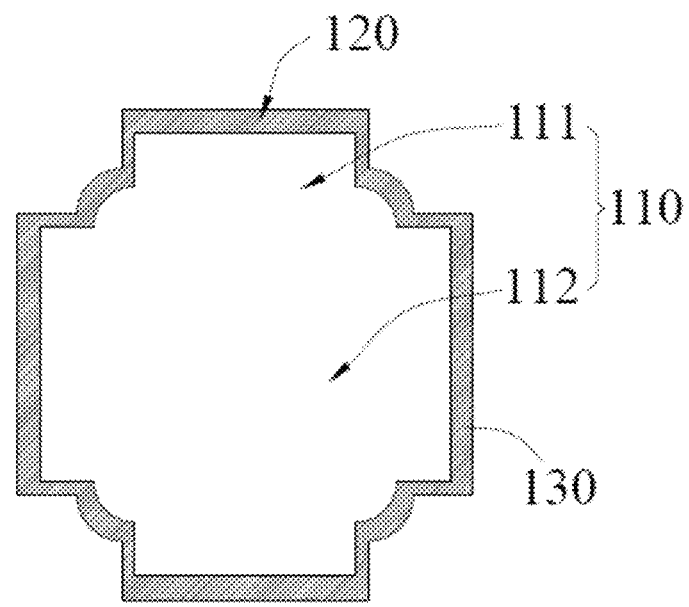
FIG. 1 is a schematic view of a display substrate according to one embodiment of the present disclosure.

The present disclosure provides in some embodiments a display substrate which, as shown in FIG. 1, include a display region 110 and a frame region 120 surrounding the display region 110. The display region 110 includes a first region 111 and a second region 112, and the quantity of sub-pixels connected to each gate line in the first region 111 is less than the quantity of sub-pixels connected to each gate line in the second region 112. The display substrate includes signal lines 130 arranged in the frame region 120, an orthogonal projection of each gate line in the first region 111 onto a base substrate of the display substrate partially overlaps an orthogonal projection of the signal line 130 onto the base substrate, and a capacitor is formed between the signal line 130 and the gate line in the first region 111 to increase a load capacitance of the gate line in the first region 111.

In the embodiments of the present disclosure, the load capacitance of the gate line in the first region 111 connected to a small quantity of sub-pixels is compensated through the signal line 130, so as to enable the load capacitance of the gate line in the first region 111 to approximate to or be even equal to the load capacitance of the gate line in the second region 112, and provide the gate lines in the display substrate with a substantially equal delay, thereby to ensure the display effect of the display device. Hence, according to the technical solution in the embodiments of the present disclosure, it is able to ensure the display effect of the display device.

Due to the installation of a camera, a microphone, a speaker and the like in the display device or due to a shape of the display device itself, the quantity of sub-pixels connected to the gate line in the first region 111 may be less than the quantity of sub-pixels connected to the gate line in the second region 112.

In some embodiments of the present disclosure, the sub-pixels connected to the gate lines in the first region may be arranged in a same mode as the sub-pixels connected to the gate lines in the second region. In other words, types of pixels, an order of the pixels, and a pitch between the pixels may all be the same.

In some embodiments of the present disclosure, the sub-pixels connected to the gate lines in the first region may also be arranged in a mode different from the sub-pixels connected to the gate lines in the second region. In other words, the types of the pixels, the order of the pixels and the pitch may be partially the same or completely different.

The arrangement modes of the sub-pixels connected to the gate lines in the first region and the second region will not be particularly defined herein, as long as the load of the gate line in the first region is less than the load of the gate line in the second region when no signal line is added in other regions (such as the frame region).

The frame region 120 may surround an outer contour of the display region 110, and a shape of the frame region 120 may be the same as a shape of the outer contour of the display region 110. For example, when a part of the outer contour of the display region 110 is of an arc-like shape, a part of the frame region 120 enclosing the part of the outer contour may also be of an arc-like shape with a same radian. A corresponding part of the signal line 130 in the frame region 120 may also be of an arc-like shape.

The display region 110 may include the first region 111 and the second region 112. The quantity of sub-pixels connected to each gate line in the second region 112 may be equal, and may be greater than the quantity of sub-pixels connected to each gate line in the first region 111.

The above-mentioned signal line may be an additional signal line at the frame region 120 for compensating the load capacitance of the gate line in the first region 111, so as to be compatible with multiple special-shaped screens without affecting a working mode of original lines in the frame region 120. The above-mentioned signal line may also be an original signal line in the frame region 120, e.g., an original low-level signal line, for compensating the load capacitance of the gate line in the first region 111. When the low-level signal line serves as the signal line, it is able to reduce the quantity of lines in the frame region 120, thereby to provide the display device with a narrow bezel.

Since a length of the first region 111 is smaller than that of the second region 112 in an extension direction of the gate line, the quantity of sub-pixels connected to the gate line in the first region 111 may be less than the quantity of sub-pixels connected to the gate line in the second region 112. In this way, the load capacitance of the gate line in the first region 111 may be smaller than the load capacitance of the gate line in the second region 112, thereby the signal delay of the gate line in the first region 111 may be different from the signal delay of the gate line in the second region 112. As a result, the display effect of the display device may be adversely affected.

Figure 2:
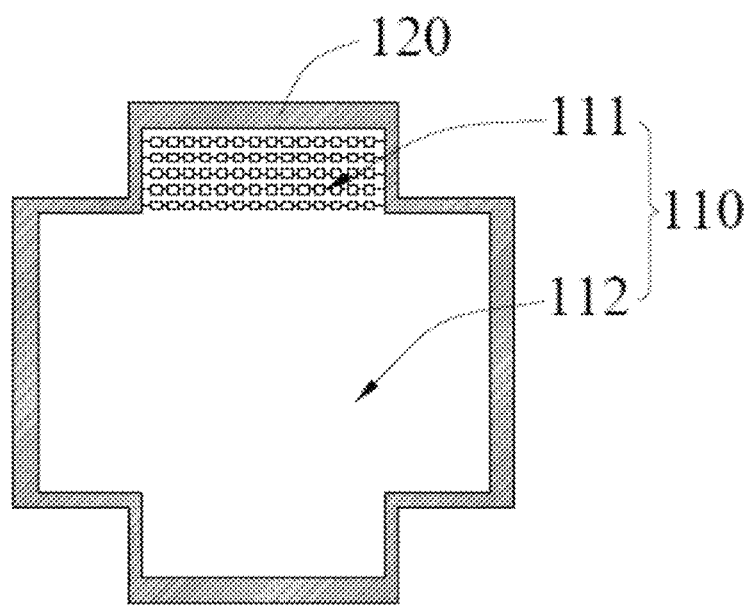
FIG. 2 is another schematic view of the display substrate according to one embodiment of the present disclosure.
Figure 3:
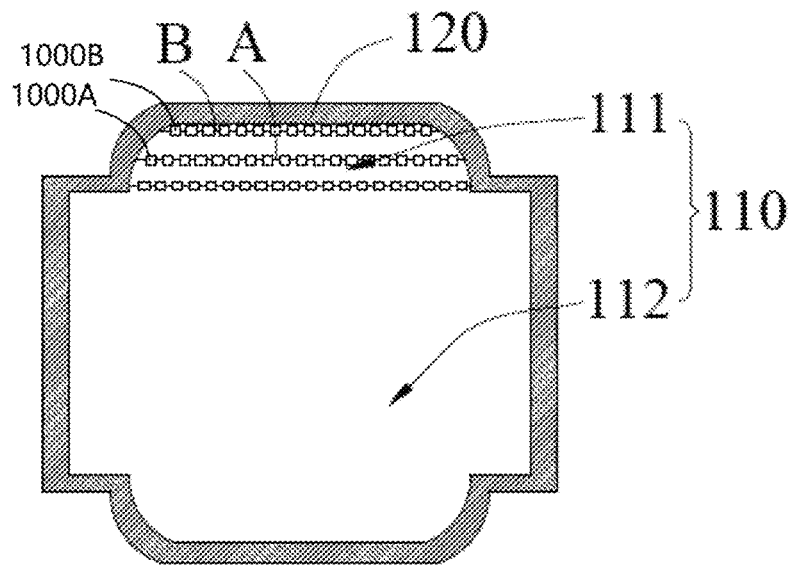
FIG. 3 is a yet another schematic view of the display substrate according to one embodiment of the present disclosure.

The quantity of sub-pixels connected to multiple gate lines in the first region 111 may be the same, as shown in FIG. 2, that is, a length of each part of the first region 111 in the extension direction of the gate may be equal. Alternatively, the quantity of sub-pixels connected to multiple gate lines in the first region 111 may also be different, as shown in FIG. 3, that is, the lengths of the parts of the first region 111 in the extension direction of the gate line may be different. Of course, the quantity of sub-pixels connected to the gate lines in some sub-regions of the first region 111 may be the same, and the quantity of sub-pixels connected to the gate lines in the other sub-regions of the first region 111 may be different, as shown in FIG. 1, which will not be particularly defined herein.

The capacitor may be formed between the signal line 130 and each gate line in the first region 111. Within a certain time period, a voltage signal jump occurs on merely one of the gate lines in the first region 111, so less interference is applied to the signal line 130 within each time period, and the stability of the signal line 130 may not be adversely affected by the jump on the gate line.

A voltage across the gate line in the first region 111 may jump. When the voltage of a gate electrode scanning signal jumps from high to low, within a voltage jump range, a time for the voltage of the gate electrode scanning signal to jump from 90% to 10% is defined as Tf. For example, when the voltage jumps from +7V to −7V and the jump range is 14V, the time for the voltage signal to jump from +5.6V to −5.6V may be Tf. Identically, when the voltage of the gate electrode scanning signal jumps from low to high, within a voltage jump range, the time for the voltage of the gate electrode scanning signal to jump from 10% to 90% is defined as Tr. The more the sub-pixels connected to the gate line, the larger the values of Tr and Tf.

Figure 4:
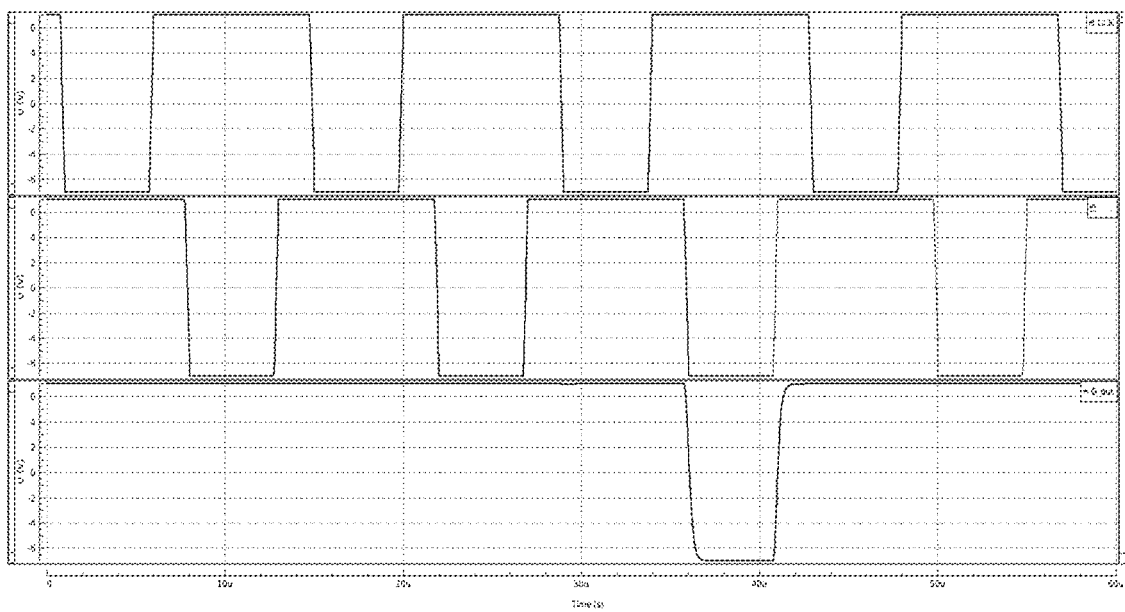
FIG. 4 is a waveform diagram of a gate electrode scanning signal in a case where a load capacitance of a gate line in the display substrate is not increased according to one embodiment of the present disclosure.

FIG. 4 is a waveform diagram of the gate electrode scanning signal on the gate line when the load capacitance of the gate line is not increased. Two waveforms above in FIG. 4 relate to two clock signals associated with the gate line in Gate Driver On Array (GOA), and a waveform below relates to the gate electrode scanning signal on the gate line. An x-axis in FIG. 4 represents the time in a unit of second, and a y-axis in FIG. 4 represents the voltage in a unit of V.

As calculated in accordance with parameters in FIGS. 4, Tr=0.43 μs and Tf=0.48 μs.

Figure 5:
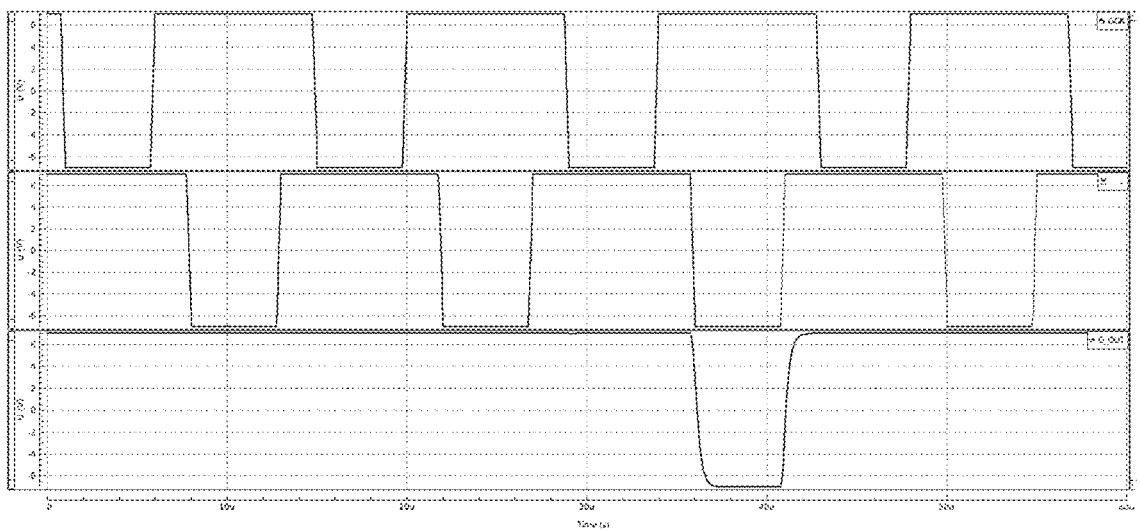
FIG. 5 is a waveform diagram of a gate electrode scanning signal in a case where the load capacitance of the gate line in the display substrate is increased according to one embodiment of the present disclosure.

FIG. 5 is a waveform diagram of the gate electrode scanning signal on the gate line when the load capacitance of the gate line is increased. Two waveforms above in FIG. 5 relate to two clock signals associated with the gate line in the GOA, and a waveform below relates to the gate electrode scanning signal on the gate line. An x-axis in FIG. 5 represents the time in a unit of second, and a y-axis in FIG. 5 represents the voltage in a unit of V.

As calculated in accordance with parameters in FIG. 5, Tr=0.56 μs and Tf=0.61 μs, that is, after the load capacitance of the gate line increases, the values of Tr and Tf for the gate electrode scanning signal on the gate line may increase too. At this time, the waveform of the gate electrode scanning signal on the gate line is closer to the waveform of the gate electrode scanning signal on the other gate line connected to more sub-pixels.

In the embodiments of the present disclosure, the signal line 130 and the gate line in the first region 111 may form the capacitor to increase the load capacitance of the gate line in the first region 111, so that the overall load capacitance of the gate lines in the first region 111 is the same as or close to the overall load capacitance of the gate lines in the second region 112. In this way, the signal delay of the gate line in the first region 111 may be the same as the signal delay of the gate line in the second region 112, so as to ensure the display effect of the display device.

Further, as shown in FIG. 3, the gate lines in the first region 111 include a first gate line A and a second gate line B, the first gate line A is located between the second region 112 and the second gate line B, and the quantity of sub-pixels 1000A connected to the first gate line A is greater than the quantity of sub-pixels 1000B connected to the second gate line B.

In this embodiment of the present disclosure, the quantity of sub-pixels connected to each gate line in the first region 111 may be different, the gate line closer to the second region 112 may be connected to more sub-pixels, and the gate line farther away from the second region 112 may be connected to fewer sub-pixels, as shown in FIG. 3.

Since the quantity of sub-pixels connected to the second gate line B is less than the quantity of sub-pixels connected to the first gate line A, in order to enable the load capacitance of the first gate line A to be close to the load capacitance of the second gate line B in the second region 112, a value of the load capacitance added by the signal line 130 to the second gate line B may be greater than a value of the load capacitance added by the signal line 130 to the first gate line A.

Figure 6:
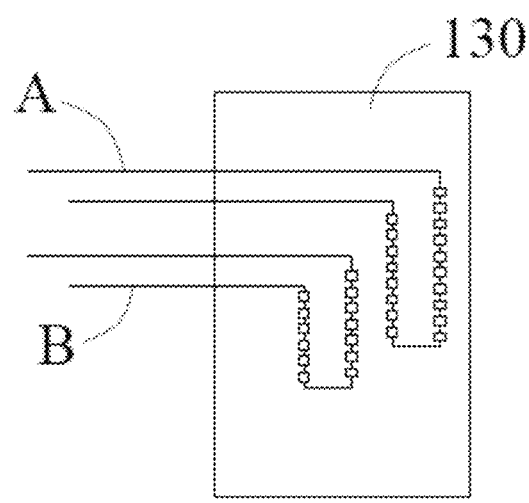
FIG. 6 is a partial schematic view of a first gate line and a second gate line in the display substrate according to one embodiment of the present disclosure.

In a possible embodiment of the present disclosure, as shown in FIG. 6, an overlapping area between an orthogonal projection of the first gate line A onto the base substrate and an orthogonal projection of the signal line onto the base substrate may be greater than an overlapping area between an orthogonal projection of the second gate line B onto the base substrate and the orthogonal projection of the signal line onto the base substrate.

The overlapping area between the gate line and the signal line 130 (the overlapping area between the orthogonal projection of the gate line onto the base substrate and the orthogonal projection of the signal line 130 onto the base substrate) may determine a size of the capacitance generated between the gate line and the signal lines 130. The larger the overlapping area, the larger the capacitance generated between the gate line and the signal line 130, and the greater the load capacitance added to the gate line.

In this embodiment of the present disclosure, when the overlapping area between the first gate line A and the signal line 130 is greater than the overlapping area between the second gate line B and the signal line 130, the load capacitance added to the first gate line A may be greater than the load capacitance added to the second gate line B, so the load capacitance of the first gate line A may approximate to, or even may be equal to, the load capacitance of the second gate line B.

Figure 7:
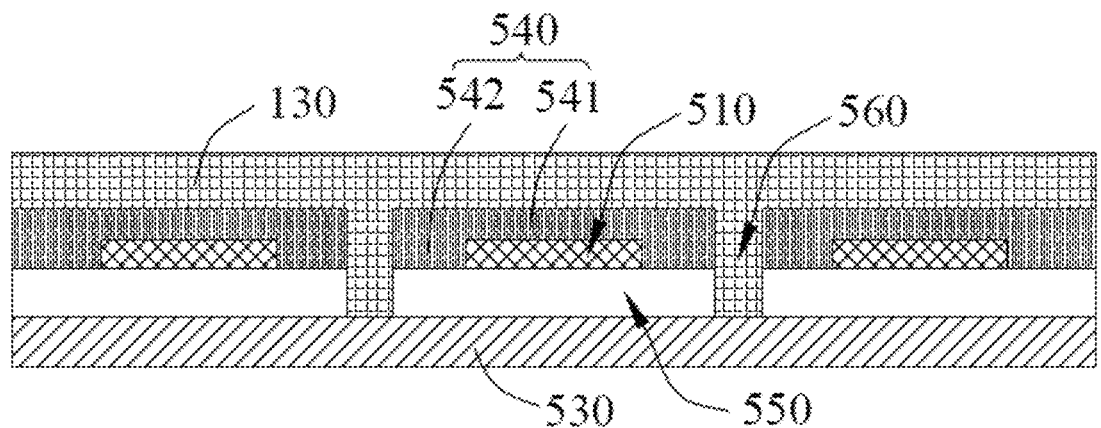
FIG. 7 is a cross-sectional view of a frame region in the display substrate according to one embodiment of the present disclosure.

In another possible embodiment of the present disclosure, as shown in FIG. 7, the frame region of the display substrate may further include a polysilicon layer 530 arranged a side of the gate line 510 in the first region away from the signal line 130. The polysilicon layer 530 may be insulated from the gate line 510 in the first region and electrically connected to the signal line 130.

In a possible embodiment of the present disclosure, the display substrate may further include a first insulating layer. The first insulating layer may include a first part arranged between the gate line and the signal line and a second part arranged between adjacent gate lines, the first part may be used to maintain insulation between the gate line and the signal line, and the second part may be used to maintain insulation between adjacent gate lines.

In this embodiment of the present disclosure, as shown in FIG. 7, the display substrate further includes a first insulating layer 540. The first insulating layer 540 includes a first part 541 arranged between the gate line 510 and the signal line 130 and a second part 542 arranged between adjacent gate lines 510, the first part 541 may maintain insulation between the gate line 510 and the signal line 130, and the second part 542 may maintain insulation between adjacent gate lines 510.

In a possible embodiment of the present disclosure, a second insulating layer may be further arranged between the polysilicon layer and the gate line, and the second insulating layer may be used to maintain insulation between the gate line and the polysilicon layer. Further, as shown in FIG. 7, a second insulating layer 550 is further arranged between the polysilicon layer 530 and the gate line 510, and the second insulating layer 550 may maintain insulation between the gate line 510 and the polysilicon layer 530.

A via hole 560 penetrating through the second part 542 of the first insulating layer 540 and the second insulating layer 550 may be formed in the display substrate, and the signal line 130 may be connected to the polysilicon layer 530 through the via hole 560.

The second insulating layer 550 may have a multi-layered structure, for example, it may include two insulating material layers stacked one on another.

To be specific, the polysilicon layer 530 may be formed on the base substrate, and the second insulating layer 550 may be formed in such a manner as to cover the polysilicon layer 530. Next, the gate line 510 may be formed at a side of the second insulating layer 550 away from the polysilicon layer 530, and the first insulating layer 540 may be formed at a side of the gate line 510 away from the polysilicon layer 530 in such a manner as to cover the gate line 510 (i.e., cover a gap between the gate lines 510). Then, the via hole 560 penetrating through the second part 542 and the second insulating layer 550 may be formed between the gate lines 510. Finally, the signal line 130 may be formed at a side of the first insulating layer 540 away from the polysilicon layer 530. At this time, the signal line 130 may be connected to the polysilicon layer 530 through the via hole 560.

Figure 8:
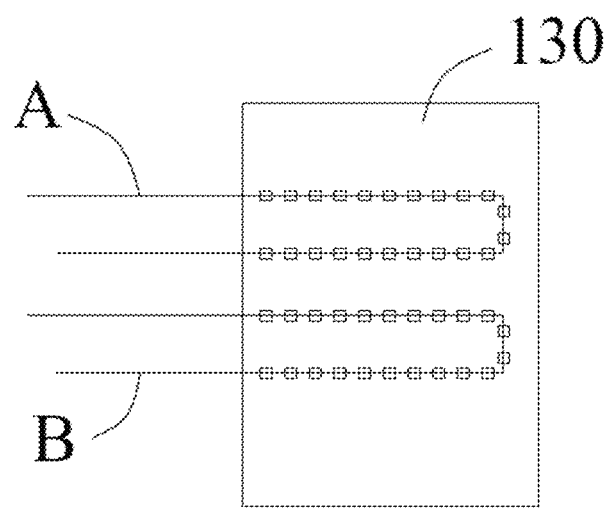
FIG. 8 is another partial schematic view of the first gate line and the second gate line in the display substrate according to one embodiment of the present disclosure.

Further, as shown in FIG. 8, the overlapping area between the orthogonal projection of the first gate line A onto the base substrate and the orthogonal projection of the signal line onto the base substrate may be larger than the overlapping area between the orthogonal projection of the second gate line B onto the base substrate and the orthogonal projection of the signal line onto the base substrate.

In this embodiment of the present disclosure, the signal line may be provided with an equal width at various positions in the frame region 120, and a wiring design of each gate line in the first region 111 may be the same in the frame region 120, so that the overlapping areas between the orthogonal projections of the gate lines in the first region 111 on the base substrate and the orthogonal projection of the signal line on the base substrate may be equal.

Further, an overlapping area between the orthogonal projection of the first gate line A onto the base substrate and an orthogonal projection of the polysilicon layer onto the base substrate may be larger than an overlapping area between the orthogonal projection of the second gate line B onto the base substrate and the orthogonal projection of the polysilicon layer onto the base substrate.

With reference to FIG. 7, the signal line 130 is electrically connected to the polysilicon layer 530 through the via hole 560, so as to form a three-layered capacitor structure consisting of the signal line, the gate line and polysilicon layer. The signal line 130 and the polysilicon layer 530 may together serve as a first plate of the capacitor, and the gate line 510 may be a second plate of the capacitor.

The signal line 130 may be connected to the polysilicon layer 530 to provide a sufficient load capacitance for the gate line in the first region, so as to avoid the occurrence of an insufficient load capacitance in the case of a two-layered capacitor structure consisting of the signal line 130 and the gate line 510.

In some embodiments of the present disclosure, the overlapping area between the orthogonal projection of the first gate line onto the base substrate and the orthogonal projection of the polysilicon layer 530 onto the base substrate may be larger than the overlapping area between the orthogonal projection of the second gate line onto the base substrate and the orthogonal projection of the polysilicon layer 530 onto the base substrate.

In some embodiments of the present disclosure, the overlapping area between the orthogonal projection of the first gate line onto the base substrate and the orthogonal projection of the polysilicon layer 530 onto the base substrate may be equal to the overlapping area between the orthogonal projection of the second gate line onto the base substrate and the orthogonal projection of the polysilicon layer 530 onto the base substrate.

In this embodiment of the present disclosure, since the signal line 130 is of a substantially constant shape, during the formation of the polysilicon layer, an area of a part of the polysilicon layer 530 overlapping the gate line 510 may be designed in accordance with a size of a compensation capacitance to be added on each gate line 510, so as to compensate the load capacitance of gate line 510 accordingly.

Figure 9:
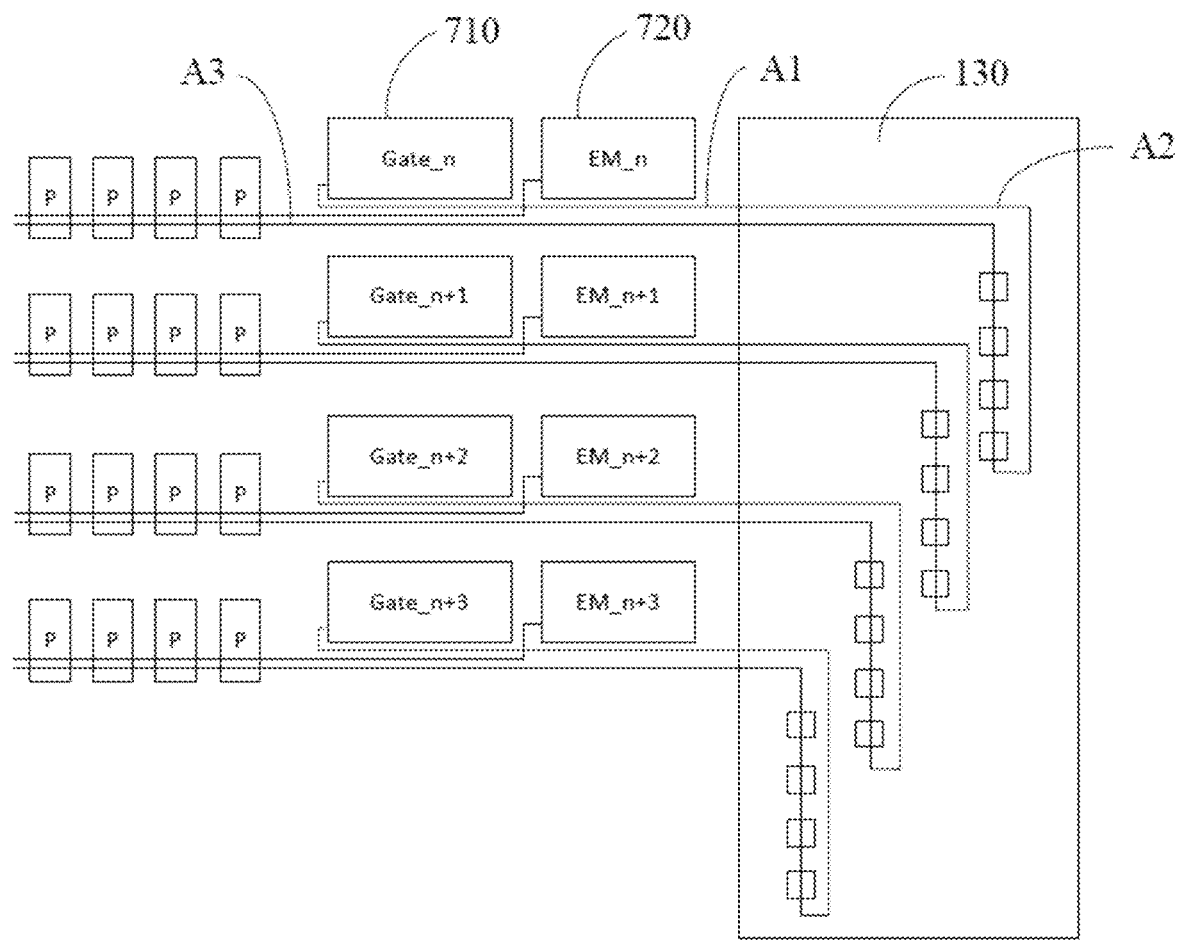
FIG. 9 is a partial schematic view of the display substrate according to one embodiment of the present disclosure.

Further, as shown in FIG. 9, a shift register unit 710 of the display substrate may be arranged in the frame region and at a side of the signal line 130 close to the display region.

In this way, the gate electrode scanning signal from the shift register unit may flow in a direction away from the display region, enter the frame region, and then flow from a region where the signal line is located toward the display region.

Further, as shown in FIG. 9, a light emission control unit 720 of the display substrate may also be arranged in the frame region and between the signal line 130 and the shift register unit 710.

As shown in FIG. 9, the gate line in the first region includes a first part A1, a second part A2, and a third part A3. An orthogonal projection of the second part A2 onto the base substrate overlaps the orthogonal projection of the signal line 130 onto the base substrate, a first end of the second part A2 is connected to the sub-pixel through the first part A1, and a second end of the second part A2 is connected to the shift register unit through the third part A3.

Specifically, a capacitor may be formed between the second part A2 of the gate line and the signal line 130 to increase the load capacitance of the gate line, so as to compensate the load capacitance of the gate line in the first region when the quantity of sub-pixels connected to the gate line in the first region is less than the quantity of sub-pixels connected to the gate line in the second region.

The larger the area of the second part A2 of the gate line as the second plate of the capacitor, the larger the increased load capacitance of the gate line; the smaller the area of the second part A2 of the gate line as the second plate of the capacitor, the smaller the increased load capacitance of the gate line.

The present disclosure further provides in some embodiments a display device which includes the above-mentioned display substrate.

The display device may be a display, a mobile phone, a tablet computer, a television, a wearable electronic device, a navigation display device, etc.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising a display region and a frame region surrounding the display region, wherein the display region comprises a first region and a second region, and a quantity of sub-pixels connected to each gate line in the first region is less than the quantity of sub-pixels connected to each gate line in the second region; and the display substrate comprises a signal line arranged in the frame region, an orthogonal projection of each gate line in the first region onto a base substrate of the display substrate partially overlaps an orthogonal projection of the signal line onto the base substrate, and a capacitor is formed between the signal line and the gate line in the first region to increase a load capacitance of the gate line in the first region.

2. The display substrate according to claim 1, wherein the signal line is a low-level signal line.

3. The display substrate according to claim 1, wherein the sub-pixels connected to the gate lines in the first region are arranged in a same mode as the sub-pixels connected to the gate lines in the second region.

4. A display device, comprising the display substrate according to claim 1.

5. The display substrate according to claim 1, wherein a shift register unit of the display substrate is located in the frame region and at a side of the signal line close to the display region.

6. The display substrate according to claim 5, wherein the gate line in the first region comprises a first part, a second part and a third part, an orthogonal projection of the second part onto the base substrate overlaps the orthogonal projection of the signal line onto the base substrate, a first end of the second part is connected to the sub-pixel through the first part, and a second end of the second part is connected to the shift register unit through the third part.

7. The display substrate according to claim 6, wherein a capacitor is formed between the second part of the gate line in the first region and the signal line to increase the load capacitance of the gate line in the first region.

8. The display substrate according to claim 1, wherein the gate lines in the first region comprise a first gate line and a second gate line, the first gate line is located between the second region and the second gate line, and the quantity of sub-pixels connected to the first gate line is greater than the quantity of sub-pixels connected to the second gate line.

9. The display substrate according to claim 8, wherein an overlapping area between an orthogonal projection of the first gate line onto the base substrate and the orthogonal projection of the signal line onto the base substrate is larger than an overlapping area between an orthogonal projection of the second gate line onto the base substrate and the orthogonal projection of the signal line onto the base substrate.

10. The display substrate according to claim 8, wherein the overlapping area between the orthogonal projection of the first gate line onto the base substrate and the orthogonal projection of the signal line onto the base substrate is equal to an overlapping area between an orthogonal projection of the second gate line onto the base substrate and the orthogonal projection of the signal line onto the base substrate.

11. The display substrate according to claim 8, wherein the frame region of the display substrate further comprises a polysilicon layer arranged at a side of the gate line in the first region away from the signal line, and the polysilicon layer is insulated from the gate line in the first region and electrically connected to the signal line.

12. The display substrate according to claim 11, wherein the signal line and the polysilicon layer jointly form a first plate of the capacitor, and the gate line is a second plate of the capacitor.

13. The display substrate according to claim 11, wherein an overlapping area between an orthogonal projection of the first gate line onto the base substrate and an orthogonal projection of the polysilicon layer onto the base substrate is larger than an overlapping area between an orthogonal projection of the second gate line onto the base substrate and the orthogonal projection of the polysilicon layer onto the base substrate.

14. The display substrate according to claim 11, wherein an overlapping area between an orthogonal projection of the first gate line onto the base substrate and an orthogonal projection of the polysilicon layer onto the base substrate is equal to an overlapping area between an orthogonal projection of the second gate line onto the base substrate and the orthogonal projection of the polysilicon layer onto the base substrate.

15. The display substrate according to claim 11, further comprising a first insulating layer, wherein the first insulating layer comprises a first part located between the gate line and the signal line and a second part located between adjacent gate lines, the first part is used to maintain insulation between the gate line and the signal line, and the second part is used to maintain insulation between adjacent gate lines.

16. The display substrate according to claim 15, wherein a second insulating layer is further arranged between the polysilicon layer and the gate line, and the second insulating layer is used to maintain insulation between the gate line and the polysilicon layer.

17. The display substrate according to claim 16, wherein a via hole penetrating through the second part of the first insulating layer and the second insulating layer is formed in the display substrate, and the signal line is connected to the polysilicon layer through the via hole.

\* \* \* \* \*

UNITED STATES PATENT AND TRADEMARK OFFICE
CERTIFICATE OF CORRECTION

| | |
|---|---|
| PATENT NO. | : 11,984,458 B2 |
| APPLICATION NO. | : 17/311889 |
| DATED | : May 14, 2024 |
| INVENTOR(S) | : Tinghua Shang, Yang Zhou and Zhengwei Luo |

It is certified that error appears in the above-identified patent and that said Letters Patent is hereby corrected as shown below:

On the Title Page

Item [73], The name of the first assignee is Chengdu BOE Optoelectronics Technology Co., Ltd.

Signed and Sealed this
First Day of October, 2024

Katherine Kelly Vidal
*Director of the United States Patent and Trademark Office*